United States Patent [19]

Kooi et al.

[11] 3,911,471

[45] Oct. 7, 1975

[54] SEMICONDUCTOR DEVICE AND METHOD OF MANUFACTURING SAME

[75] Inventors: Else Kooi; Johannes Antonius Andress Van Gils, both of Eindhoven, Netherlands

[73] Assignee: U.S. Philips Corporation, New York, N.Y.

[22] Filed: Dec. 4, 1973

[21] Appl. No.: 421,526

[30] Foreign Application Priority Data

Dec. 29, 1972 Netherlands .................... 7217783

[52] U.S. Cl. .................... 357/50; 148/175; 357/35; 357/44; 357/48

[51] Int. Cl.[2] .................. H01L 27/04; H01L 21/76; H01L 21/95

[58] Field of Search ....... 317/235 E, 235 F; 357/48, 357/49, 50

[56] References Cited

UNITED STATES PATENTS

| | | | |
|---|---|---|---|
| 3,226,611 | 12/1965 | Haenichen | 317/235 |
| 3,423,650 | 1/1969 | Cohen | 317/235 E |
| 3,502,951 | 3/1970 | Hunts | 317/235 E |
| 3,648,125 | 3/1972 | Peltzer | 357/50 |
| 3,755,014 | 8/1973 | Appels et al. | 357/50 |
| 3,783,047 | 1/1974 | Paffen et al. | 357/50 |
| 3,796,613 | 3/1974 | Magdo et al. | 357/50 |

OTHER PUBLICATIONS

Cosand, "High Speed Low Power Bipolar I.C. Process," IEEE International Electron Devices Meeting, Digest of Technical Papers, pp. 35–37 (Dec. 3, 1973).

*Primary Examiner*—William D. Larkins
*Attorney, Agent, or Firm*—Frank R. Trifari; Jack Oisher

[57] ABSTRACT

A semiconductor device having an island-shaped region of one conductivity type which is bounded by a region of the opposite conductivity type present below it, by an insulating pattern which is at least partly inset in the body, and by an isolation zone of the said opposite conductivity type which adjoins the insulating pattern and the region of the opposite type, a semiconductor circuit element being present entirely within the island-shaped region. According to the invention, the isolation zone extends through the insulating pattern up to a part of the semiconductor surface bounded entirely by said pattern so as to facilitate contacting of the isolation zone and so as to obtain isolation zones of high doping.

12 Claims, 13 Drawing Figures

SEMICONDUCTOR DEVICE AND METHOD OF MANUFACTURING SAME

Figure 1:
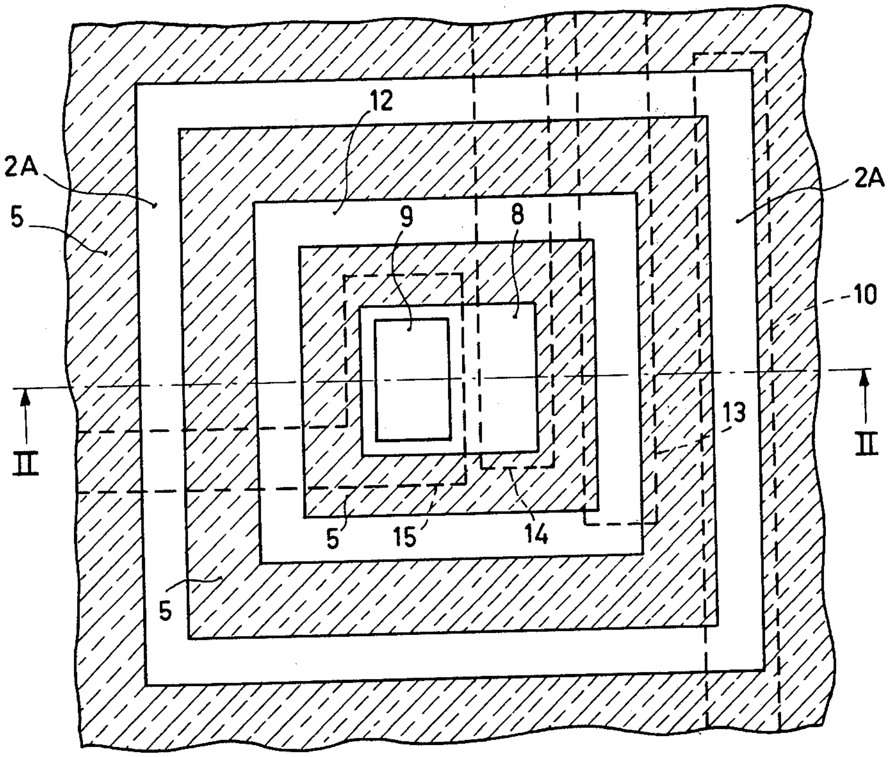

The invention relates to a semiconductor device having a semiconductor body with at least one semiconductor circuit element, present entirely within an island-shaped body part isolated by a p-n junction and a pattern of electrically insulating material which is at least partly inset in the semiconductor body.

The invention furthermore relates to a method of manufacturing such a device.

Devices as described above are known and are described, for example, in "Philips Research Reports" volume 26, June, 1971, pp. 166–180. Such structures are very suitable for applications in monolithic semiconductor circuits, inter alia due to the achievable high packing density and the possibility of determining, by means of one single mask, the dimensions and the location of a large number of zone of the circuit ultimately to be realized (self-registration).

However, the devices known so far exhibit several drawbacks which may in certain circumstances result in undesired restrictions in the application thereof. This can be explained as follows.

In known structures of the type described, (see for example, FIG. 4 of the aforementioned publication) the isolated island is part of a first region of a first type conductivity separated by an isolation zone generally formed by a zone of the second conductivity type which adjoins a second region of the second type (which may be, for example, the substrate) and is fully covered at the surface by the inset insulating pattern. Such a structure is often manufactured by first providing type-converting doping material to form the isolation zone in the surface of the first region and then providing the insulating pattern on the highly doped surface zone by local or selective oxidation of the doped semiconductor surface. With the growth or insetting of the oxide pattern, the doped zone moves deeper in the semiconductor body. In certain circumstances, however, a considerable part of the doping material may be absorbed in the oxide, in particular when the doping material is an acceptor, for example, boron. In consequence of the resulting decreased dopant concentration it will be difficult, at least for acceptable values of the oxidation time, to obtain below the inset oxide an isolation zone which has a thickness (vertical depth) which is considerably larger than, for example, the thickness of the oxide pattern itself. Since, when useful oxidation times are used, the typical depth of penetration of the oxide pattern generally is not larger than 1 to 2 microns, it will therefore not be possible with this known method for the overall thickness below the surface of the oxide pattern together with the isolation zone to be more than approximately 4 to 5 microns. From this it follows that one cannot use an epitaxial layer which is much thicker than about 5 microns in the known structures, which often is an undesired restriction.

A further drawback is that in those cases in which the isolation zone is to be contacted it is necessary in the described known structures to provide a contact window in the thick insert oxide pattern through the whole thickness of the oxide pattern. As a result of the long etching times necessary for that purpose, problems occur in practice with the masking and unavoidable underetching, as a result of which it is very difficult to provide contact windows of small and accurately determined dimensions.

It is one of the objects of the present invention to remove or at least considerably reduce the said drawbacks occurring in known devices.

The invention is inter alia based on the recognition of the fact that the above-described drawbacks can be avoided by a new configuration of the inset pattern and the isolation zone, and that in addition offers further advantages making possible various interesting semiconductor structures which are difficult to realize in another manner, as will be described in detail hereinafter.

According to the invention, a semiconductor device of the type described above is characterized in that the isolation zone extends through the inset insulating pattern up to a part of the said surface which is bounded entirely by the inset insulating pattern.

Although the known structure often gives very good satisfaction and is very simple to realize for island isolation, it has been found in practice that the apparently unnecessarily complicated structure according to the invention offers a number of important advantages.

One important advantage in the device according to the invention is that, since the isolation zone is not entirely covered by the inset insulating pattern but extends through an aperture in said pattern up to the original semiconductor surface, the isolation zone can easily be contacted at the area of said aperture. Actually, at most only a thin insulating layer, for example, an oxide layer, is present above the said aperture.

A further important advantage of the device according to the invention is that, since in the manufacture of said new structure the isolation zone can be provided without objection after providing the inset insulating pattern, the doping concentration of the isolation zone can be chosen independent of the steps for the manufacture of the inset pattern. As a result of this, an isolation zone with high doping may be used which is capable of penetrating from the surface throughout the entire thickness of, for example, an epitaxial layer of comparatively large thickness, which according to a preferred embodiment is at least 5 microns thick.

Although the first region of the first conductivity type may be formed entirely by the said island-shaped region with the isolation zone extending laterally to the edge of the semiconductor body, preferably a structure is used in which the isolation zone separates an island-shaped part from the remaining part of the first region. In a preferred embodiment, the first region is an epitaxial layer which is divided into two or more parts by the isolation zone, several of which may be island-shaped. Through the surface part where the isolation zone reaches the semiconductor surface need in principle not be contacted it is often advantageous to construct the device so that the said surface part is at least partly covered with a conductive layer serving as a connection electrode.

Figure 2:
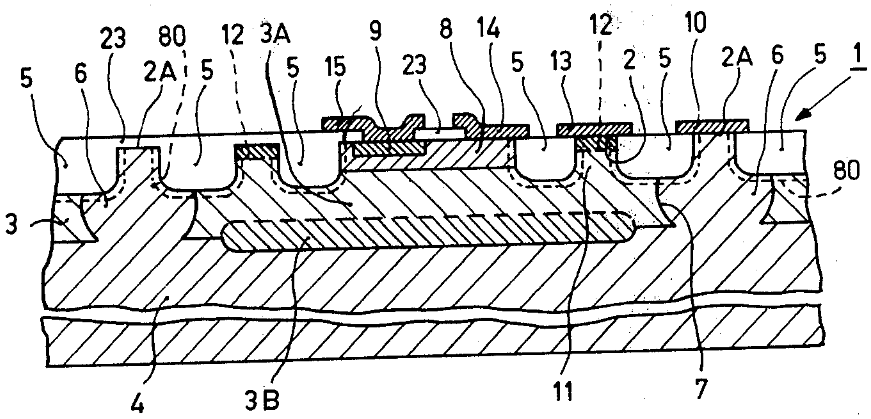

The invention will now be described in greater detail with reference to a few embodiments and the drawing in which FIG. 1 is a diagrammatic plan view of a device according to the invention, FIG. 2 is a diagrammatic cross-sectional view of the device shown in FIG. 1 taken on the line II—II, FIGS. 3 to 9 are diagrammatic cross-sectional views of the device shown in FIGS. 1 and 2 during successive stages of manufacture, and FIGS. 10, 11, 12 and 13 are diagrammatic cross-sectional views of other embodiments of devices according to the invention.

The figures are diagrammatic and not drawn to scale, in which notably the dimensions in the direction of thickness are shown strongly exaggeratedly. Corresponding parts are generally referred to by the same reference numerals in the various examples. Semiconductor regions of the same conductivity type are generally shaded in the same direction. In the plan view of FIG. 1, the inset oxide pattern is shaded and the boundaries of metal layers are denoted in broken lines.

FIG. 1 is a diagrammatic plan view and FIG. 2 a diagrammatic cross-sectional view taken on the line II—II of FIG. 1 of a semiconductor device according to the invention. The figure shows a part of an integrated circuit having a circuit element, in this case a bipolar transistor (3, 8, 9) and comprises a semiconductor body 1 of silicon having an n-type conductive first region 3 which adjoins an uppermost surface 2 and adjoins a p-type conductive second region 4 which is present below it and which is formed by a substrate on which the region 3 is provided in the form of an epitaxial layer. The region 3 furthermore comprises a highly doped n-type conductive buried layer 3B.

A pattern 5 of silicon oxide provided by local oxidation is in this example inset substantially entirely below the surface 2 in the body. An island-shaped part 3A, B of the region 3 which comprises the layer 3B is entirely surrounded within the body by a p-type conductive isolation zone 6 which extends down to the second region (in this case the substrate) 4. The p-n junction 7 between the isolation zone 6 and the island 3A adjoins the inset insulating pattern 5. The region 3A, B forms the collector zone of the transistor. A p-type conductive zone 8 adjoining the surface 2 and bounded by the inset pattern 5 forms the base zone of the transistor, while an n-type surface zone 9 which is provided in the base zone 8 forms the emitter zone of the transistor. The transistor thus is present entirely within the island-shaped region (3A, B). The emitter and base zones 9 and 8 are contacted by metal layers 15 and 14.

In known embodiments of a device having a bipolar transistor as shown in FIG. 2, the isolation zone 6 extends entirely below the whole thickness of the inset pattern 5. In certain circumstances this may present important drawbacks, as already described, in particular with respect to the contacting of the zone or zones 6 and with respect to the doping concentration thereof which must be high when the layer 3 is comparatively thick.

According to the invention, however, the isolation zone 6 extends through the inset pattern 5 up to a part 2A of the surface 2, which part 2A is entirely bounded by the inset pattern 5. This has the important advantage that the zone 6 can be easily contacted, for example, via the metal layer 10, without it being necessary to etch for that purpose a contact window through the whole thickness of the pattern 5.

A further important advantage is that the zone 6 may be provided, if desired, after the provision of the inset pattern 5, for example, by diffusion, as a result of which the doping and the depth of the isolation zone 6 are entirely independent of the process steps used for providing the inset pattern 5.

The surface part 2A surrounds the island-shaped part of the first region 3 in this example entirely so that the zone 6 can be provided throughout its extent after the formation of the pattern 5. In cases in which the epitaxial layer 3 is not too thick, this is not strictly necessary and the isolation zone 6 may be caused to emerge at the surface only locally, via an aperture in the pattern 5, for example for contacting purposes.

In the example described, the p-n junction 7 adjoins a part of the isulating pattern 5 which has an aperture 11 within the island-shaped region 3A, said aperture surrounding the base zone 8 entirely, the region 3A within the aperture 11 comprising at the surface a highly doped n-type conductive zone 12 by which the formation of an inversion channel at the surface at the area of the aperture 11 is avoided. The zone 12 is entirely bounded by the inset oxide 5, forms a channel interrupting zone between the base zone 8 and the isolation zone 6 and surrounds the active parts of the transistor zones 9, 8 and 3A entirely. Said zone 12 is also contacted with a metal layer 13 which forms the collector connection of the transistor. According to a variation of this structure, the zone 12 may also extend through the whole thickness of the region 3A down to the buried layer 3B. In this structure, the channel interrupting zone 12 may be kept very narrow and has a width of approximately 3 microns in the present example.

It is furthermore pointed out that the place of the surface part 2A may be chosen entirely arbitrarily relative to the surrounding insulating pattern 5. As a result of this, if there is a danger of breakdown between the isolation zone 6 and a semiconductor zone present at one side thereof, for example, in the island, the width on said side of the inset oxide 5 which bounds the surface part 2A may be chosen to be wider than elsewhere, as a result of which the said breakdown is avoided. This will be of importance in particular if elements which are operated at high voltage are present in the monolithic circuit.

Figure 3:
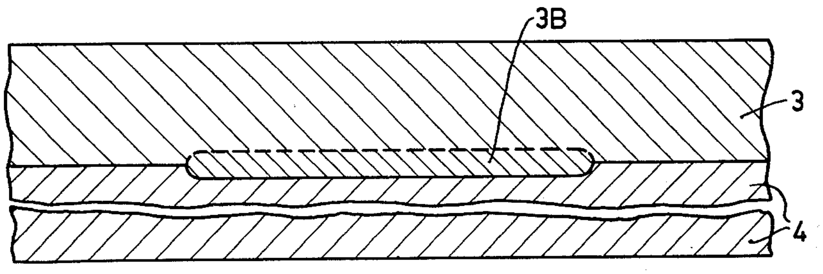

The device according to the invention shown in FIGS. 1 and 2 may be manufactured, for example, as follows. Starting material (see FIG. 3) is a p-type silicon plate 4 having a thickness of, for example, 200 microns and a resistivity of, for example, 10 Ohm. cm. An arsenic deposit is locally provided on said plate by using conventionally used masking and diffusion methods to form the buried layer 3B after which the surface is prepared for epitaxial growth and an n-type silicon layer 3 having a thickness of, for example, 6 microns and a resistivity of, for example, 0.5 Ohm. cm is grown epitaxially on the substrate 4, likewise with the use of generally known methods. The structure shown in FIG. 3 is obtained in which during the epitaxial growth the said arsenic deposit diffuses partly in the substrate 4 and partly in the epitaxial layer 3 to form a highly doped n-type buried layer 3B.

A layer masking against oxidation is then provided on the surface, for example, a 0.15 micron thick layer 20 of silicon nitride. If desired, a thin oxide layer may be provided below the layer 20. A 0.1 micron thick layer 21 of silicon oxide is deposited on the nitride layer 20. If desired, said layer may also be obtained by thermal oxidation of the silicon nitride but will in that case be generally considerably thinner. The oxide layer 21 is then brought to the desired shape by a known photolithographic etching method, after which said layer 21 serves as a mask during the etching, for example, by phosphoric acid, of the parts of the layer 20 not covered by the layer 21. For all the details of the provision and etching of silicon nitride layers, reference is made to Appels et al., "Philips Research Reports," April 1970, pp. 118–132, in which all the information necessary to those skilled in the art is given for methods relating to the local oxidation of silicon surfaces.

Figure 4:
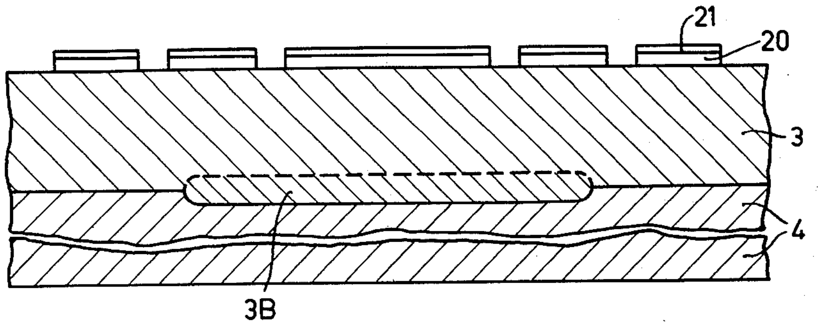
Figure 5:
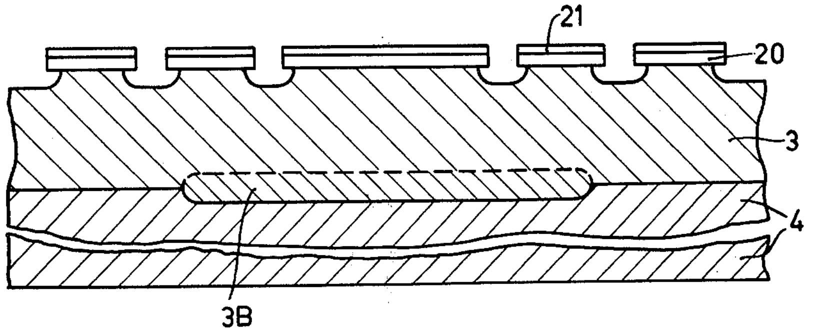

In this manner the structure shown in FIG. 4 is obtained. The part of the silicon surface not covered by the anti-oxidation mask 20 is now etched down to a depth of approximately 1 micron, a part of the silicon being also etched below the edges of the nitride 20, see FIG. 5. Said etching step serves to obtain a substantially flat surface after providing the inset insulating pattern, but if desired this etching step may be omitted.

Figure 6:
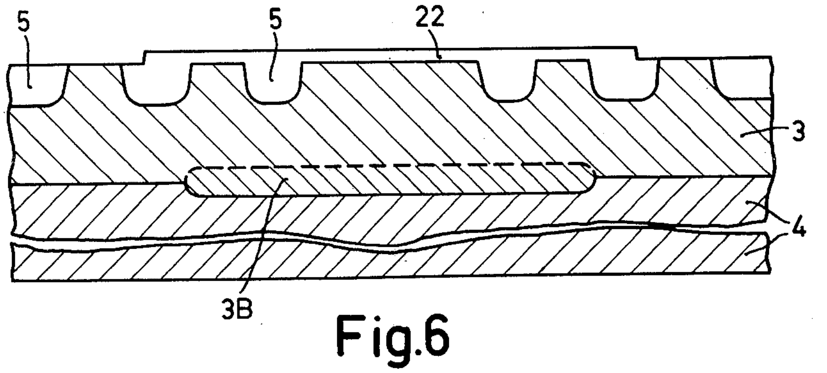
Figure 7:
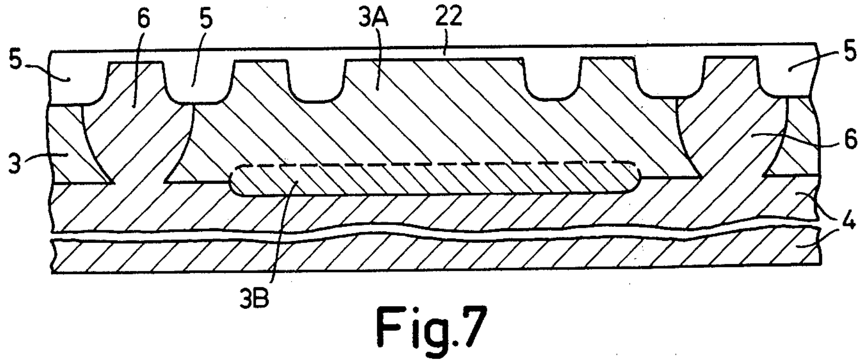

The silicon is then oxidized thermally at 1,000°C in moist oxygen for approximately 16 hours, the cavities resulting from the etching treatment being filled entirely with oxide as a result of the fact that the oxide occupies a larger volume than the silicon from which it is formed. The resulting oxide pattern 5 has a thickness of approximately 2 microns and extends up to the original silicon surface 2, so that the surface of the whole body becomes substantially flat. After removing the nitride, a silicon oxide layer 22 is deposited pyrolytically in known manner over the assembly, said layer being removed at the area of the insulation zones to be provided while using a mask with wide tolerance. In this manner the structure shown in FIG. 6 is obtained.

In a subsequent step, a deep boron diffusion is carried out, the inset oxide pattern 5 and the oxide layer 22 serving as a mask. In this manner the isolation zone 6 is obtained, see FIG. 7, by which an island-shaped part 3A, B is separated from the remaining part of the layer 3. During said boron diffusion, the zones 6 are covered with oxide; the differences in thickness of the oxide layer are neglected in the figure for reasons of clarity.

Figure 8:
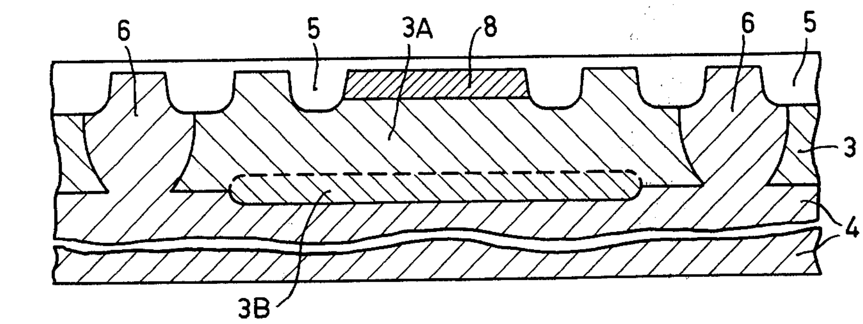

A part of the oxide layer 22 above the base zone to be provided is then removed, likewise while using a masking step with wide tolerance, after which the base zone 8 of the transistor is provided by means of, for example, a 2 microns deep boron diffusion, the layer 22 and the oxide pattern 5 serving as masks. The zone 6 need not be masked. In this manner the structure shown in FIG. 8 is obtained in which a thin oxide layer is formed during the diffusion on the zones 6 and 8, the oxide layer on the surface being in the figure again shown as of constant thickness for reasons of clarity.

Figure 9:
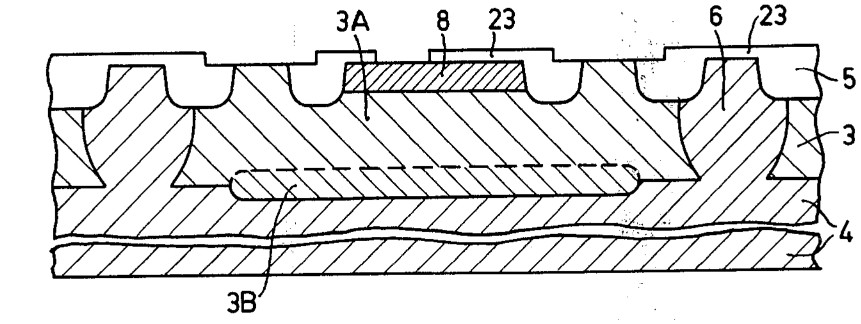

At the area of the zones 9 and 12 to be formed, see FIG. 9, apertures are then etched in the oxide by a photo-etching step. The emitter zone 9 which is, for example, 1 micron thick, and the highly doped n-type surface zone 12 are provided by a phosphorus diffusion. According to a variation, the emitter zone may adjoin the inset pattern 5 on one side as a result of which the mask tolerance for the emitter diffusion window is also wide.

Contact windows are then provided in the usual manner and the emitter contact layer 24, the base contact layer 25, the collector contact layer 13 and the contact layer 10 which contacts the substrate 4 via the zone 6 are then provided by vapour deposition and etching of a metal layer, for example aluminum, as a result of which the structure shown in FIGS. 1 and 2 is obtained.

According to the above-described manufacturing method, a great advantage of the invention consists in that the position of most zones, in this example of the zones 8, 12 and 6, is determined entirely by one single mask, namely the anti-oxidation mask 20, so that a great extent of self-registration and a maximum restriction of masking steps with narrow tolerance is achieved. In the case in which the emitter zone adjoins the inset oxide pattern, the semiconductor structure which is provided in the epitaxial layer 3 may be manufactured entirely by using, besides the nitride mask 20, only masking steps with wide tolerance.

Figure 10:
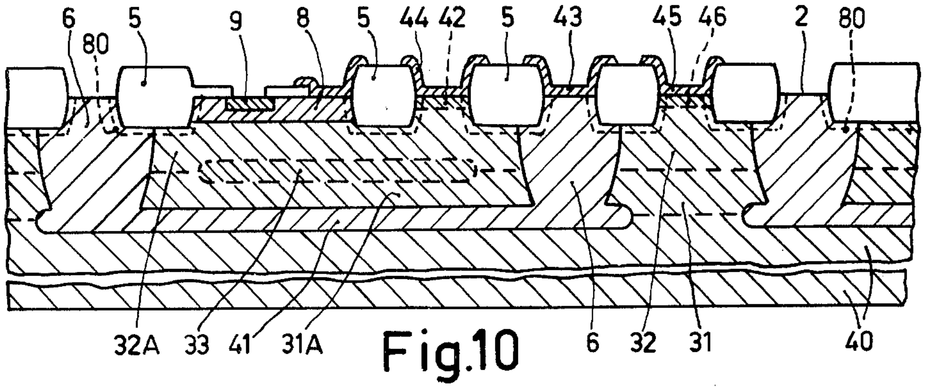

This also applies to the following examples. FIG. 10, for example, is a diagrammatic cross-sectional view of a device according to the invention having a bipolar transistor with an n-type emitter zone 9 and a p-type base zone 8 which are bounded entirely by an oxide pattern 5 which is partly inset in the body. In this example, the oxide pattern projects above the silicon surface 2 substantially equally far as it is sunk below it since during its provision an etching step as in FIG. 5 of the preceding example has been omitted. The first region consists in this case of two successively provided n-type conductive epitaxial layers 31 and 32 of which the parts 31A and 32A form an island-shaped region which is surrounded by the isolation zone 6. At the interface of the layers 31 and 32, said island-shaped region comprises a highly doped n-type conductive buried layer 33. The layers 31 and 32 are provided on an n-type substrate 40. Both epitaxial layers 31 and 32 have a thickness, for example, of approximately 3 microns.

The p-type conductive second region in this example is not formed by the substrate 40 but by a p-type conductive buried layer 41 which is present at the area of the interface between the substrate 40 and the epitaxial layer 31. The isolation zone 6 adjoins the buried layer 41 and emerges at the surface via an aperture in the inset insulating pattern 5 where it is contacted by a metal layer 43. The collector zone (31A, 32A, 33) is contacted at the surface of a metal layer 44 and a highly doped n-type contact zone 42. The substrate 40 is contacted, via the layers 31 and 32, by a metal layer 45 which contacts the layer 32 via a highly doped n-type contact zone 46.

One of the important advantages of said structure is that the reverse voltage between the sub-substrate (41, 6) and the collector zone (31A, 32A, 33) is independent of the voltage applied between the substrate 40 and the region (41, 6). Since the capacity of the p-n junction which bounds the island may provide problems from a circuit technical point of view and said capacity is determined inter alia by the voltage across the p-n junction, the application of sub-substrates as described above presents the possibility of influencing said island isolation capacity independently of the voltage applied to the substrate 40.

The device shown in FIG. 10 may be manufactured while using the same methods as in the preceding example, in which the starting material, however, is an n-type substrate 40 on which in the usual manner a local deposit of an acceptor which preferably diffuses comparatively slowly, for example, boron, is then provided to form the buried layer 41, after which a first n-type epitaxial layer 31 is grown. A local deposit of a comparatively slowly diffusing donor, for example, arsenic, is then provided on the layer 31 to form the buried layer 33, after which the n-type layer 32 is grown. The provision of the oxide pattern 5, of the insulation zone 6 and of the zones 8, 9, 42 and 46 may then be carried out in the manner as described in the preceding example with reference to FIGS. 3 to 9, in which, however, in this case no silicon is etched away before the local oxidation to manufacture the oxide pattern 5, so that the oxide 5 projects partly above the surface 2. The oxide pattern 5 will project, for example, approximately 1 micron above the surface 2 and be inset approximately 1 micron below the surface 2.

Several buried layers 41 and also several isolation zones 6 may be provided to form several islands and sub-substrates, for example, as is shown on the right-hand side of FIG. 10. Of course the circuit may also comprise elements which are not present within such a sub-substrate.

Figure 11:
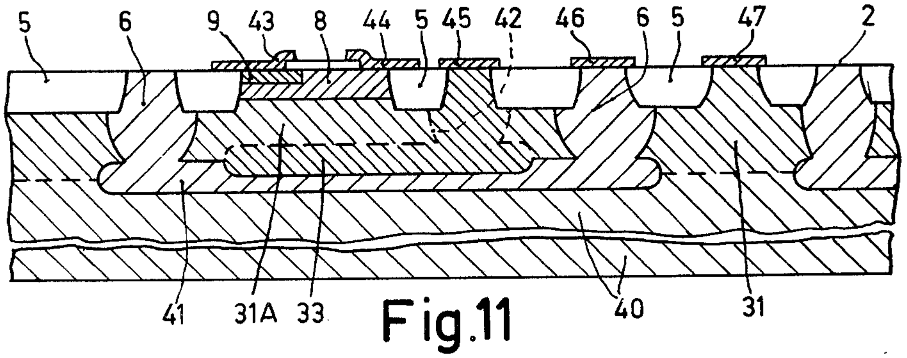

In this example two epitaxial layers 31 and 32 were provided between which the buried layer 33 is present. It will be obvious, however, that, if desired, the buried layer 33 may be provided on top of and adjoining the buried layer 41, in which case only one epitaxial layer 31 need be grown after providing said two buried layers. This is shown in FIG. 11 in which a device is shown which otherwise has in principle has same structure as the device of FIG. 10 with the exception of the fact, however, that in FIG. 11 the oxide pattern, as in FIGS. 1 and 2, is inset substantially entirely below the surface 2, that the highly doped n-type zone 42 extends down to the buried layer 33 (and can hence not be provided, as in FIG. 10, simultaneously with the emitter 9), and that the emitter zone 9 adjoins the oxide pattern 5 on one side. The zones 9, 8, 42, 6 and 31 are contacted by metal layers 42 to 47; the thickness of the layer 31 is, for example, 10 microns.

The device shown in FIG. 11 may also be manufactured entirely in analogy with the methods described in the manufacture of the devices shown in FIGS. 1 and 2 and FIG. 10 in which those skilled in the art can, of course, choose many variations from the possibilities available to them. It is pointed out in particular that both in the examples already described and in the examples still to be described the various semiconductor zones to be provided in the body can be provided, instead of by diffusion, in another manner, for example, by ion implantation and that the diffusion can also be carried out in various manners, for example, starting from a doped oxide layer.

Figure 12:
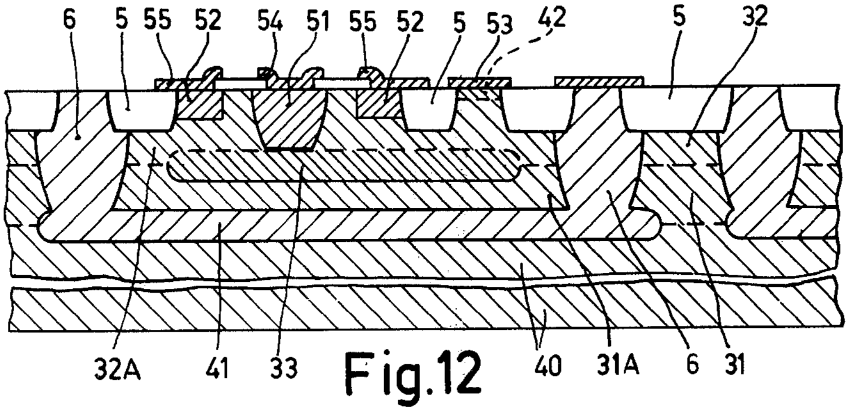

FIG. 12 is a diagrammatic cross-sectional view of another example of a device according to the invention. The construction of said device is to a considerable extent analogous to that shown in FIG. 10 in as far as it relates to the n-type substrate 40, the n-type epitaxial layers 31 and 32, the p-type buried layer 41 and the n-type buried layer 33. The circuit element provided in the island-shaped region (31A, 32A), however, in this case is a lateral p-n-p transistor having a p-type emitter zone 51 and a p-type collector zone 52 which surrounds said emitter zone and which engages the oxide pattern 5. The base zone 32A is contacted via an n-type diffusion 42 and a metal layer 53, the emitter and collector zones 51 and 52 are contacted by metal layers 54 and 55. The emitter zone 51 extends down to the highly doped n-type buried layer 33 so that emission takes place substantially entirely in a lateral direction, and the zone 51 may be provided, if desired, simultaneously with the isolation zone 6. If desired, the collector zone 52 may also extend down to the buried layer 33.

Although in the example of FIG. 12 two n-type epitaxial layers 31 and 32 are used, the buried layer 33 may in this case also be provided, if desired, directly on top of the buried layer 41, in analogy with FIG. 11.

Figure 13:
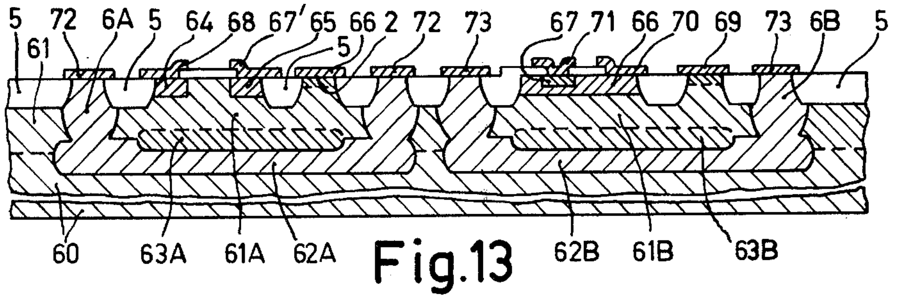

FIG. 13 finally is a diagrammatic cross-sectional view of a device which comprises two different semiconductor circuit elements which are each provided in an island-shaped region (61A; 61B) which is present entirely within a p-type sub-substrate (6A, 62A, 6B, 62B), said sub-substrates being each contacted separately by metal layers 72 and 73 which in this example entirely surround the islands 61A and 61B.

A lateral bipolar transistor having a p-type emitter zone 64 and a p-type collector zone 65 is present in the first n-type conductive island 61A. Said zones 64 and 65 engage the inset oxide pattern 5 so that the emitter zone 64 can emit substantially over one side only. This provides a better efficiency than in the conventional planar technology in which the emitter of such a lateral transistor can emit in substantially all directions. The emission perpendicular to the surface 2 of the silicon plate may even be further restricted by diffusing the zone 64 and possibly also the zone 65 to such a depth that they adjoin the highly doped n-type buried layer 63A. The base 61A of the transistor 64, 61A, 65 is contacted, via an aperture in the oxide pattern 5 and a highly doped n-type contact diffusion, by means of a metal layer 66. It is to be noted that a lateral transistor, for example the transistor (64, 61A, 65) represents a new and very efficacious structure of a lateral bipolar transistor with the use of an inset insulating pattern, even in the absence of sub-substrate (6A, 62A). Contacts 67' and 68 make contact to the zones 64 and 65.

The sub-substrate (6B, 62B) surrounds an n-type island 61B which comprises a bipolar vertical transistor which is substantially equal to the bipolar transistors of FIGS. 10 and 11. In this case, the emitter is formed by zone 67. The collector contact is 69, the base contact 70, and the emitter contact 71. It will be obvious that within several sub-substrates (6, 62) a number of different semiconductor circuit elements may be provided, while also one island may in certain circumstances comprise more than one circuit element.

All the examples described show the already mentioned advantages which are caused by the fact that the isolation zones 6 extends through an aperture in the oxide pattern 5 up to a part of the original silicon surface 2 which is bounded entirely by the pattern 5.

As regards the manufacture of the various described devices it is to be noted that they all comprise a large number of regions determined by one single mask, namely the mask used for the manufacture of the inset insulating patteren 5, so that a high degree of self-registration is achieved.

It will be obvious that the invention is not restricted to the above embodiments given only by way of illustration but that many variations are possible to those skilled in the art without departing from the scope of this invention. For example, other semiconductor circuit elements such as diodes, resistors, junction field effect transistors, insulated gate field effect transistors, planar thyristors and the like may be provided within an island-shaped region instead of or besides the bipolar transistors described. Instead of from the surface, the isolation zone may at least partly be diffused from the substrate side, for example, from a buried layer. Instead of silicon the semiconductor body may be another semiconductor material, preferably a material from which an insulating pattern can be formed also be local oxidation, for example, silicon carbide. Instead of from silicon oxide, the insulating pattern may consist of another insulating material. If the pattern consists of an oxide of the semiconductor body, this may be formed, instead of by thermal oxidation, also by other oxidation methods, for example, by anodic oxidation. The metal layers may be replaced entirely or partly by other readily conducting layers, for example, of doped polycrystalline silicon. In all the examples, the said conductivity types may all be replaced simultaneously by their opposite conductivity types, while the dimensions, in particular the thicknesses, and the doping of the semiconductor layers present, may also be varied within wide limits. Materials other then silicon nitride may furthermore be used as a mask against oxidation.

The island doping below the oxide pattern may also be increased locally so as to prevent inversion.

Such an increased doping concentration under the inset oxide may for instance be obtained by diffusion or ion implantation before, simultaneously with, or after providing the inset oxide pattern, as described in Belgian Pat. No. 768,076. For illustration purposes such a locally increased doping concentration, in these examples of donor atoms, is shown in FIGS. 2 and 10 with a broken line 80. It should be stressed that due to the present invention there is no danger for formation of an n-channel over the entire p-type isolation zone 6, even when the n-layer 80 is not higher doped than the p-type zone 6, since zone 80 is interrupted at the same location (surface 2A) where the inset oxide pattern 5 above zone 6 is interrupted.

What is claimed is:

1. A semiconductor device having a semiconductor body with plural isolated semiconductor circuit elements, said body comprising a substrate portion and on the substrate portion a semiconductive layer having a substantially uniform thickness into which the circuit elements are incorporated, said semiconductive layer having a first region of a first type conductivity adjoining its uppermost surface and also adjoining a second region of the substrate portion and of a second, opposite type conductivity forming a generally horizontal P-N junction, and means for laterally isolating from each other island-shaped parts of said first region of said semiconductive layer, said lateral isolation means comprising annular portions of a pattern of an electrically insulating material which is deeply inset in but not through the semiconductive layer and which surround each island-shaped first region part at the surface, each isolated circuit element being present entirely within an island-shaped first region part, and a doped annular isolation zone of the second type conductivity which extends below the inset pattern and down into the second region forming with a first region part a generally vertical P-N junction that terminates on the insulating pattern portion, said doped isolation zone having a portion extending upwardly through the inset pattern above it to a part of the said semiconductive layer which is laterally bounded entirely by a portion of the inset insulating pattern and which is spaced from the layer's uppermost surface a distance much less than the maximum thickness of the insulating pattern, said doped isolation zone having a second type dopant concentration exceeding the first type dopant concentration of the adjacent first region portions.

2. A semiconductor device as claimed in claim 1, wherein the upwardly-extending isolation zone portion reaches the semiconductive layer's uppermost surface, and a conductive layer serving as a connection electrode at least partly covers and contacts the said upwardly-extending isolation zone portion.

3. A semiconductor device as claimed in claim 1, wherein the said upwardly-extending isolation zone portion is annular-shaped.

4. A semiconductor device as claimed in claim 1, wherein the upwardly-extending isolation zone portion has a narrower cross-section than the part below it.

5. A semiconductor devices as claimed in claim 1 wherein the second region comprises a buried layer of the second type conductivity which extends between the first region part and an underlying substrate of the first type conductivity on which the first region is grown epitaxially, said second type buried layer together with the second type isolation zone entirely surrounding the island-shaped part of the first region within the semiconductor body, said island-shaped part comprising a buried layer of the first type conductivity.

6. A semiconductor device as claimed in claim 5, wherein the buried layer of the first type conductivity is provided on and adjoining the buried layer of the second type conductivity.

7. A semiconductor device as claimed in claim 1, wherein the vertical P-N junction terminates on a portion of the inset insulating pattern which has an aperture within the isolated island-shaped part, the island-shaped part within the aperture comprising at its uppermost surface a channel-interrupting zone having such a high doping that the formation of an inversion channel at the area of the aperture is prevented.

8. A semiconductor device as claimed in claim 7, wherein the channel-interrupting zone surrounds the active zones of a semiconductor circuit element present in the isolated island-shaped part.

9. A semiconductor device as claimed in claim 7, wherein a highly doped zone of the first type conductivity extends from the aperture substantially down to a buried layer of the first type conductivity present in the isolated island-shaped part.

10. A semiconductor device as claimed in claim 1, wherein a surface-adjoining zone of the second type conductivity is provided in the isolated island-shaped part and is bounded entirely by the inset insulating pattern, in which zone a surface-adjoining zone of the first type conductivity is provided, the zone of the second type conductivity forming the base zone of a vertical bipolar transistor whose emitter and collector zones are formed by the island-shaped part and the said zone of the first type conductivity.

11. A semiconductor device as claimed in claim 1, wherein the first region is an epitaxially-grown layer-shaped region having a thickness of at least 5 microns.

12. A semiconductor device as claimed in claim 1, wherein the circuit element comprises a bipolar lateral transistor having spaced surface-adjoining emitter and collector zones adjoining part of the insulating pattern.

* * * * *